United States Patent
Alexander (10) Patent No.: US 8,278,677 B2
(45) Date of Patent: Oct. 2, 2012

(54) LIGHT EMITTING DIODE LAMP WITH LOW THERMAL RESISTANCE

(75) Inventor: Zhbanov Alexander, Ansan-si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 359 days.

(21) Appl. No.: 12/059,284

(22) Filed: Mar. 31, 2008

(65) Prior Publication Data

US 2008/0237625 A1 Oct. 2, 2008

(30) Foreign Application Priority Data

Mar. 30, 2007 (KR) .................. 10-2007-0032004

(51) Int. Cl.
*H01L 33/00* (2010.01)
(52) U.S. Cl. .................. 257/99; 257/100; 257/E23.101; 257/E33.066
(58) Field of Classification Search .................. 257/666, 257/676, 692, 696, E23.043, E23.045, 79, 257/98–100, 675, 431–433
See application file for complete search history.

(56) References Cited

U.S. PATENT DOCUMENTS

| | | | | |
|---|---|---|---|---|
| 3,609,475 | A | * | 9/1971 | Kaposhilin .................. 257/99 |
| 3,676,668 | A | * | 7/1972 | Collins et al. .................. 313/499 |
| 3,739,241 | A | * | 6/1973 | Thillays .................. 257/100 |
| 3,764,862 | A | * | 10/1973 | Jankowski .................. 257/98 |
| 3,855,606 | A | * | 12/1974 | Schoberl .................. 257/99 |
| 4,550,333 | A | * | 10/1985 | Ridder et al. .................. 257/82 |
| 4,863,806 | A | * | 9/1989 | Merrick et al. .................. 428/571 |
| 4,984,057 | A | * | 1/1991 | Mii .................. 257/692 |
| 5,606,182 | A | * | 2/1997 | Yoshida et al. .................. 257/99 |
| 5,841,177 | A | * | 11/1998 | Komoto et al. .................. 257/431 |
| 6,054,716 | A | * | 4/2000 | Sonobe et al. .................. 250/552 |
| 6,084,252 | A | * | 7/2000 | Isokawa et al. .................. 257/98 |
| 6,407,411 | B1 | * | 6/2002 | Wojnarowski et al. .................. 257/99 |
| 6,518,600 | B1 | * | 2/2003 | Shaddock .................. 257/98 |
| 6,521,916 | B2 | * | 2/2003 | Roberts et al. .................. 257/100 |
| 6,646,491 | B2 | * | 11/2003 | Worley et al. .................. 327/514 |
| 6,679,608 | B2 | * | 1/2004 | Bechtel et al. .................. 359/604 |

(Continued)

FOREIGN PATENT DOCUMENTS

DE 198 33 245 2/1999

(Continued)

OTHER PUBLICATIONS

Extended European Search Report issued Oct. 22, 2009 by the European Patent Office in European Patent Application No. 08006182.3.

(Continued)

*Primary Examiner* — Long Tran
*Assistant Examiner* — Jordan Klein
(74) *Attorney, Agent, or Firm* — H.C. Park & Associates, PLC (57) ABSTRACT

Disclosed is a light emitting diode lamp that has low resistance to heat emitted therefrom. The LED lamp may include a heat coupling member thermally coupling a top part of a first lead to a top part of a second lead. The LED lamp may further include one or more top parts for lowering thermal resistance of the LED lamp. This configuration facilitates heat transfer from the first lead having an LED chip mounted thereon to the top part of the second lead and/or to the other top parts, lowering resistance to heat emitted from the LED lamp.

22 Claims, 6 Drawing Sheets

U.S. PATENT DOCUMENTS

| | | | |
|---|---|---|---|
| 6,683,325 B2 * | 1/2004 | Waitl et al. | 257/81 |
| 6,784,464 B2 * | 8/2004 | Ichikawa et al. | 257/99 |
| 6,921,927 B2 * | 7/2005 | Ng et al. | 257/99 |
| 7,380,961 B2 * | 6/2008 | Moriyama et al. | 362/238 |
| 7,381,996 B2 | 6/2008 | Chen | |
| 7,405,433 B2 * | 7/2008 | Chew | 257/99 |
| 7,420,271 B2 * | 9/2008 | Hsu | 257/695 |
| 7,466,076 B2 * | 12/2008 | Lin et al. | 313/512 |
| 7,543,946 B2 * | 6/2009 | Ockerse et al. | 359/604 |
| 2004/0004435 A1 * | 1/2004 | Hsu | 313/512 |
| 2005/0110027 A1 * | 5/2005 | Park et al. | 257/81 |
| 2005/0116246 A1 * | 6/2005 | Isokawa et al. | 257/100 |
| 2005/0133810 A1 * | 6/2005 | Roberts et al. | 257/99 |
| 2005/0173723 A1 * | 8/2005 | Weng et al. | 257/100 |
| 2006/0131591 A1 | 6/2006 | Sumitani | |
| 2006/0261362 A1 * | 11/2006 | Noda et al. | 257/98 |
| 2007/0228391 A1 * | 10/2007 | Minami et al. | 257/79 |
| 2008/0128740 A1 * | 6/2008 | Yamashita et al. | 257/99 |
| 2009/0289274 A1 * | 11/2009 | Park | 257/99 |

FOREIGN PATENT DOCUMENTS

| | | | |
|---|---|---|---|
| JP | 63-167768 | | 11/1988 |
| JP | 06-216411 | | 8/1994 |
| JP | 09-246603 | | 9/1997 |
| JP | 11-103097 | | 4/1999 |
| JP | 2000183406 A | * | 6/2000 |
| JP | 3100687 | | 1/2004 |
| JP | 2004-241401 | | 8/2004 |
| JP | 2005-079578 | | 3/2005 |
| JP | 2005-294334 | | 10/2005 |
| JP | 2006-093672 | | 4/2006 |
| JP | 2006-173359 | | 6/2006 |
| TW | 454950 | | 9/2001 |
| TW | 486153 | | 5/2002 |
| TW | 548858 | | 8/2003 |
| TW | 200616249 | | 5/2006 |

OTHER PUBLICATIONS

Preliminary Notice of First Office Action dated Feb. 22, 2012 for corresponding Taiwanese Patent Application No. 097111560.

* cited by examiner

LIGHT EMITTING DIODE LAMP WITH LOW THERMAL RESISTANCE

CROSS REFERENCE TO RELATED APPLICATIONS

This application claims priority from and the benefit of Korean Patent Application No. 10-2007-0032004, filed on Mar. 30, 2007, which is hereby incorporated by reference for all purposes as if fully set forth herein.

BACKGROUND OF THE INVENTION

1. Field of the Invention

The present invention relates to a light emitting diode lamp, and more particularly to a light emitting diode lamp that has low resistance to heat radiated therefrom.

2. Discussion of the Background

Light Emitting Diode (LED) lamps can realize various colors and are widely used for display lights, electronic display boards, and display devices. Further, the LED lamps are is also applied to general lighting based on characteristics of realizing white light. The LED lamps have various merits, such as high efficiency of light emission, long service life, and environmentally friendliness, which enable a continuous increase in application of the LED lamps to various fields.

Figure 1:
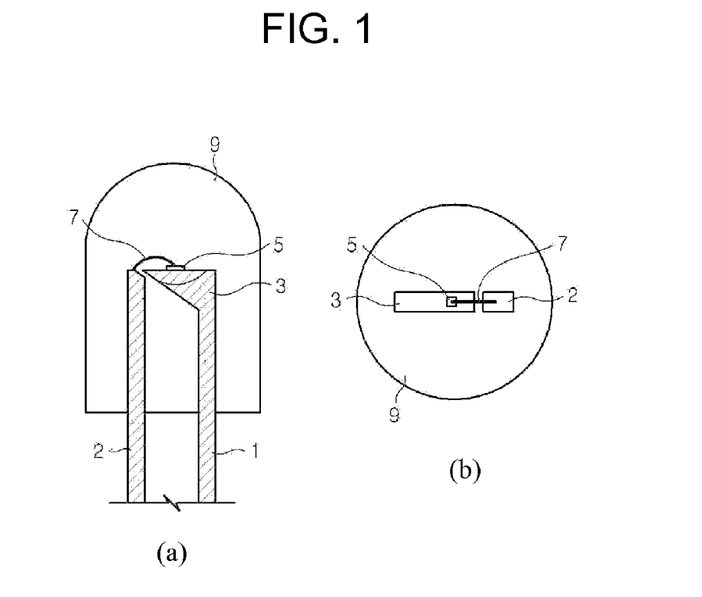

FIGS. 1 (a) and (b) are a front view and a plan view of a conventional LED lamp, respectively.

Referring to FIG. 1, the conventional LED lamp includes a first lead 1 which has a top part 3 and a leg extending from the top part 3. A second lead 2 is spaced apart from the first lead 1. The second lead 2 has a leg corresponding to that of the first lead 1 and a top part adjacent the top part 3 of the first lead 1.

An LED 5 is mounted on the top part 3 of the first lead 1 and is electrically connected to the top part of the second lead 2 via a bonding wire 7. Generally, the top part 3 of the first lead has a cavity formed to receive the LED 5 therein. A side wall of the cavity constitutes a sloped reflection surface to reflect light emitted from the LED 5 in a predetermined direction.

A transparent encapsulating material 9 surrounds the top parts of the first and second leads 1 and 2 and LED 5. The transparent encapsulating material 9 is formed of a silicone or epoxy resin which transmits light emitted from the LED 5. On the other hand, a curable resin containing a phosphor may cover the LED 5 within the cavity.

Figure 2:
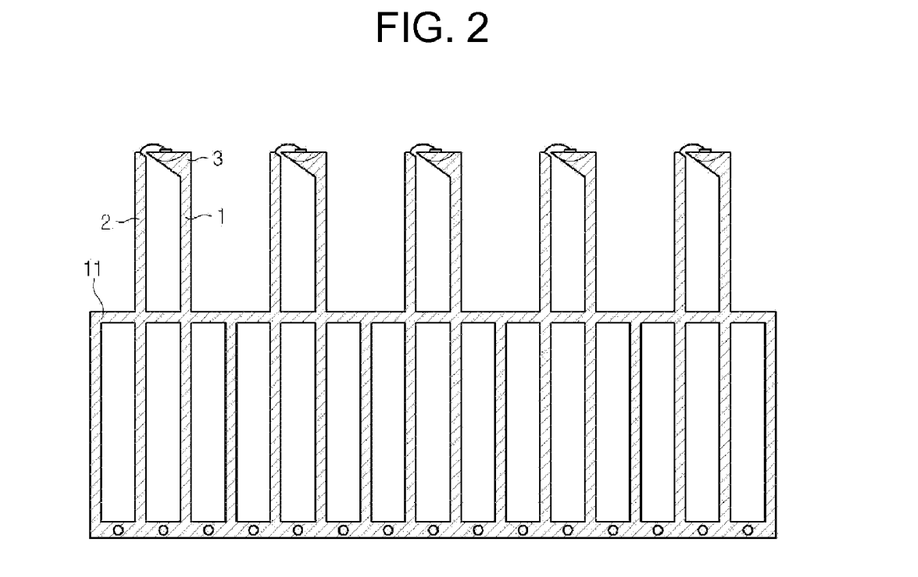
FIG. 2 is a view illustrating a lead frame used for the LED lamp shown in FIG. 1.

FIG. 2 shows a lead frame used for the LED lamp shown in FIG. 1.

Referring to FIG. 2, an alloy plate having a predetermined thickness is punched to form first leads 1 and second leads 2, each of which has a top part and is supported by a support frame 11. The first and second leads 1 and 2 are arranged on the same plane.

LEDs 5 are mounted on the top parts of the first leads 1 and electrically connected to the second leads 2 via bonding wires 7. Then, the encapsulating material 9 (see FIG. 1) is prepared to cover the LEDs 5 and the top parts of the first and second leads 1 and 2. Generally, the encapsulating material 9 is formed by disposing the first and second leads 1 and 2 upside down in a mold containing a liquid or gel epoxy resin, followed by curing the epoxy resin. Before forming the encapsulating material 9, a curable resin may be dotted on the LEDs 5.

Then, the first and second leads 1 and 2 are separated from the support frame, thereby completing individual LED lamps.

Figure 3:
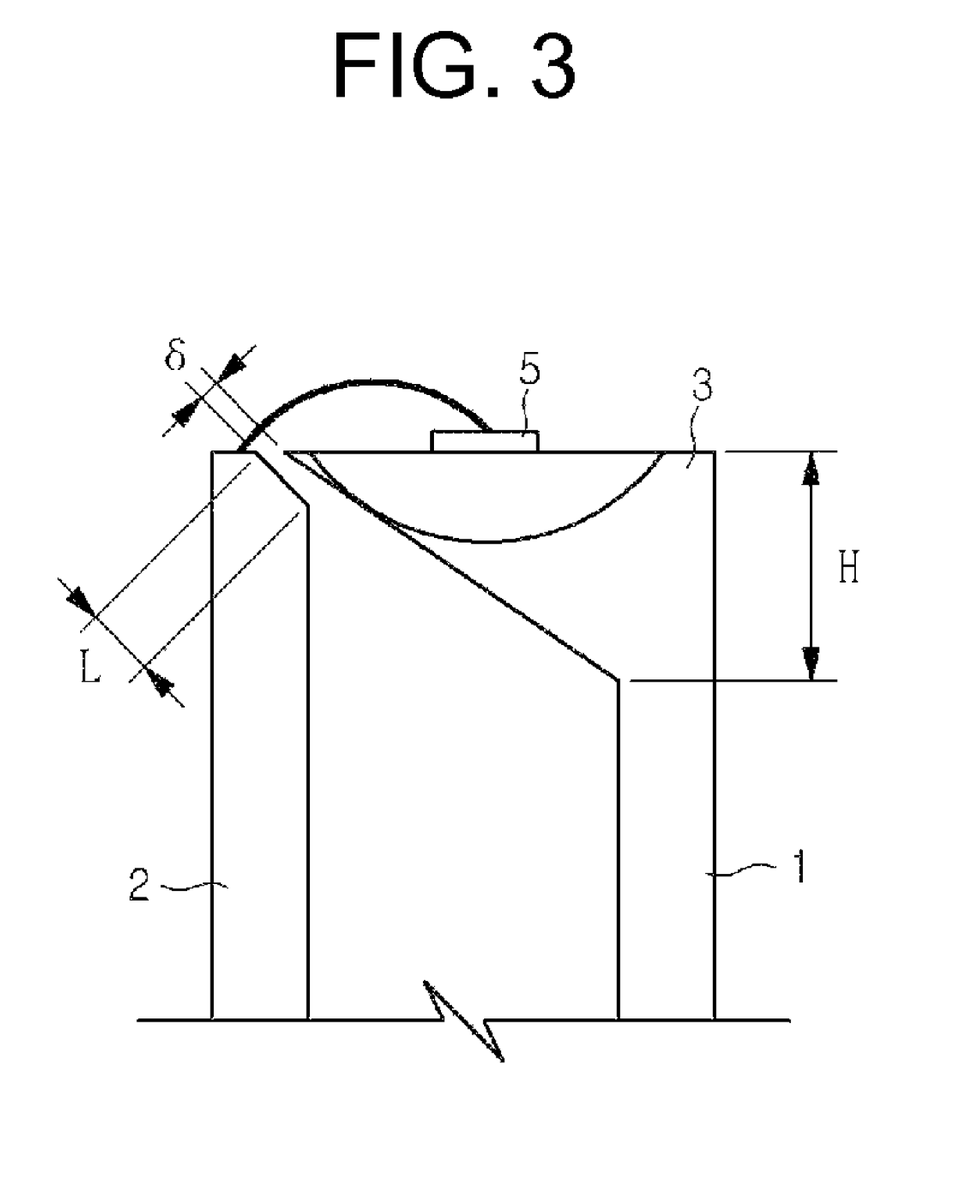
FIG. 3 is a partially enlarged plan view of the lead frame shown in FIG. 2.

FIG. 3 is a partially enlarged view of the lead frame illustrating problems of the conventional LED lamp.

Referring to FIG. 3, the top part 3 of the first lead 1 has a height (H) and the top part of the second lead 2 is formed with a plane which faces the top part 3 of the first lead 1 and has a length (L). The plane having the length (L) is separated a distance (δ) from the top part of the first lead 1. Since the encapsulating material 9 (see FIG. 1) surrounds the top parts of the first and second leads 1 and 2, the encapsulating material 9 is disposed between the top parts of the first and second leads 1 and 2.

Such a conventional LED lamp has many problems relating to thermal resistance.

First, since the encapsulating material 9 is formed of only a transparent material, opaque materials, such as ceramics or plastics, which have high thermal conductivity and are used for general semiconductor packages, cannot be applied to the encapsulating material 9. Thus, there is a limit in dissipating heat through the encapsulating material 9.

Second, since the first lead 1 has the very thin and long leg, there is a limit in dissipating heat through the leg. Additionally, although heat can be transferred to the second is lead through the bonding wire 7, there is a limit in heat transfer due to the thinness and length of the bonding wire 7.

Third, there is a limit in heat transfer from the top part 3 of the first lead 1 to the adjacent top part of the second lead 2. In other words, the top part of the second lead 2 adjacent to the top part 3 of the first lead 1 is relatively narrow, whereas a distance between the top parts is significantly wide. Further, since the transparent encapsulating material 9 having a lower thermal conductivity is disposed between the top parts, there is a limit in heat transfer from the top part 3 of the first lead 1 to the top part of the second lead 2.

Figure 4:
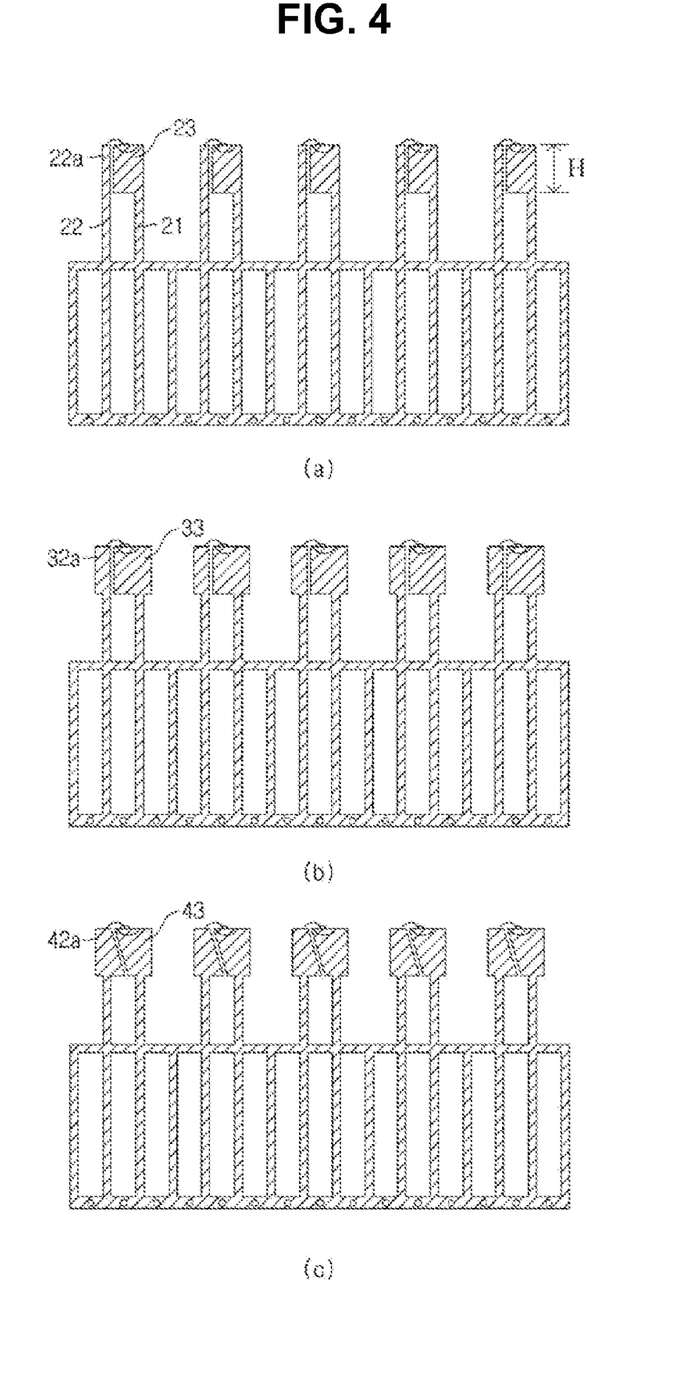

Various attempts have been made to lower the problematic thermal resistance of the conventional LED lamp. FIG. 4 shows conventional lead frames of LED lamps designed to reduce the thermal resistance.

In a lead frame shown in FIG. 4 (a), a first lead 21 has a rectangular top part 23 which has an increased height (H). With this configuration, the top part 23 of the first lead 21 has enhanced thermal capacity, and adjacent sections between the top part 23 of the first lead 21 and a top part 22a of a second lead 22 are increased, thereby reducing the thermal resistance.

Simulation with a heat transfer coefficient of 40 W/m²K in still air, surrounding temperature of 0° C., and power of 1 W applied to an LED chip showed that height increases to 1 mm, 2 mm, and 3 mm resulted in thermal resistances of 87° C./W, 79° C./W, and 73° C./W, respectively.

In a lead frame shown in FIG. 4 (b), like the first lead 21 of FIG. 4 (a), a first lead of this lead frame has a rectangular top part 33 which has an increased height (H) to increase a surface area of the top part 33 adjacent to a top part 32a of a second lead. Additionally, ears are respectively provided to the top parts 33 and 32a of the first and second leads to increase thermal is capacity of the top parts 33 and 32a, thereby lowering the thermal resistance.

In FIG. 4 (a), when the height (H) of the top part is 3 mm, the thermal resistance was reduced to 71° C./W by addition of the ears.

In a lead frame shown in FIG. 4 (c), top parts 43 and 42a of first and second leads are formed with ears like the lead frame shown in FIG. 4 (b), but have a trapezoidal shape to further increase surface areas of adjacent planes. Accordingly, heat transfer from the top part 43 of the first lead to the top part 42a of the second lead can be promoted, thereby lowering the thermal resistance.

According to the conventional techniques, the thermal resistance can be lowered to some degree by increasing the height of the top part of the first lead, forming the ears or increasing the surface areas of adjacent planes between the top part of the first lead and the top part of the second lead. However, increasing the height of the top part of the first lead, forming the ears or increasing the surface areas of adjacent planes between the top part of the first lead and the top part of the second lead cannot achieve sufficient reduction in thermal resistance due to the size of the LED lamp.

Therefore, there is a need for a new LED lamp that can lower the thermal resistance by facilitating heat transfer from a top part of a first lead to other parts.

SUMMARY OF THE INVENTION

The present invention is conceived to solve the problems of the conventional techniques as described above, and it is an aspect of the present invention to provide a light emitting diode lamp capable of lowering thermal resistance by facilitating heat transfer from a top part, on which a light emitting diode is mounted, to other parts of the lamp.

In accordance with an aspect of the present invention, a light emitting diode lamp includes a first lead having a first top part and a leg extending from the first top part. A second lead is spaced apart from the first lead. The second lead has a second top part adjacent the top part of the first lead and a leg extending from the second top part. A light emitting diode is mounted on the first top part and is connected to the second top part via a bonding wire. An encapsulating material surrounds the light emitting diode, and the first and second top parts. A heat coupling member is formed of an insulating material having a higher thermal conductivity than the encapsulating material and thermally couples the first top part to the second top part. The heat coupling member can promote heat transfer from the first top part to the second top part, thereby lowering thermal resistance of the light emitting diode lamp.

The heat coupling member may be disposed between the first and second top parts, or may surround side surfaces of the first and second top parts. The heat coupling member may be formed of ceramics or plastics used for a semiconductor package and having higher thermal conductivity.

The first top part may include an upper surface having an elongated rectangular shape. First opposite side surfaces having smaller surface areas are connected to shorter edges of the upper surface, and second opposite side surfaces having larger surface areas are connected to longer edges of the upper surface. A lower surface is connected to the first and second opposite side surfaces. Such a top part can be easily formed by punching an alloy plate. The light emitting diode is mounted on the upper surface of the top part. The upper surface may be formed with a cavity, in which the light emitting diode is mounted.

The second top part may be disposed adjacent one of the first opposite side surfaces having the smaller surface areas. Therefore, the second top part may be formed along is with the first top part by punching the alloy plate.

Alternatively, the second top part may be disposed adjacent one of the second opposite side surfaces having the larger surface areas. At this time, the second top part may include side surfaces having smaller surface areas, and side surfaces having larger surface areas, one of which is disposed to face one of the second side surfaces of the first top part. Here, the heat coupling member may be interposed between the side surfaces of the first and second top parts facing each other.

The second top part may be formed to be located coplanar with the first top part by punching an alloy plate, and one of the legs extending from the first top part and the second top part may be twisted such that the larger side surface of the second top part can face the larger side surface of the first top part. Accordingly, the leg extending from the first top part or the leg extending from the second top part has a twisted portion.

The light emitting diode lamp may further include a third top part disposed adjacent the first top part. The third top part is spaced apart from at least one of the first and second top parts within the encapsulating material. Hence, heat can be transferred from the first top part to the third top part, thereby lowering the thermal resistance of the light emitting diode lamp.

The heat coupling member may thermally couple at least one of the first and second top parts to the third top part. This configuration can further promote heat transfer from the first top part to the third top part.

The light emitting diode lamp may further include a fourth top part disposed adjacent the first top part in addition to the third top part. The fourth top part is spaced apart from at least one of the first and second top parts within the encapsulating material. Hence, the is fourth top part can also lower the thermal resistance of the light emitting diode lamp. Meanwhile, the first and second top parts may be disposed between the third and fourth top parts. Accordingly, heat can be uniformly transferred from the first top part to the third and fourth top parts, thereby improving heat transfer efficiency.

The heat coupling member may thermally couple the first to fourth top parts, thereby minimizing the thermal resistance.

In accordance with another aspect of the present invention, a light emitting diode lamp includes a first lead having a first top part and a leg extending from the first top part. A second lead is spaced apart from the first lead. The second lead has a second top part adjacent the top part of the first lead and a leg extending from the second top part. Additionally, a third top part is disposed adjacent the first top part while being spaced apart from at least one of the first and second top parts. A light emitting diode is mounted on the first top part and is connected to the second top part via a bonding wire. An encapsulating material surrounds the light emitting diode, and the first to third top parts. With this configuration, heat can be transferred from the first top part to the second and third top parts, thereby lowering thermal resistance of the light emitting diode lamp compared to the conventional techniques.

A heat coupling member may thermally couple at least one of the first and second top parts to the third top part. The heat coupling member can promote heat transfer from the first top part to the third top part, thereby further lowering the thermal resistance of the light emitting diode lamp.

The light emitting diode lamp may further include a fourth top part disposed adjacent the first top part while being spaced apart from at least one of the first and second top parts. Accordingly, heat can be transferred from the first top part to the fourth top part, thereby lowering the thermal resistance of the light emitting diode lamp.

The heat coupling member may thermally couple one of the first and second top parts to the fourth top part.

In accordance with a further aspect of the present invention, a light emitting diode lamp includes a first lead having a first top part and a leg extending from the first top part. The first top part may include an upper surface having an elongated rectangular shape, first opposite side surfaces connected to shorter edges of the upper surface and having smaller surface areas, second opposite side surfaces connected to longer edges of the upper surface and having larger surface areas, and a lower surface connected to the first and second opposite side surfaces. The leg extends from the lower surface of the first top part. Further, a second lead is spaced apart from the first lead. The second lead has a second top part disposed adjacent one of the second opposite side surfaces having the larger surface areas, and a leg extending from the second top part. A light emitting diode is mounted on the upper surface of the first top part and is connected to the second top part via a bonding wire. An encapsulating material surrounds the light emitting diode, and the first and second top parts.

Since the second top part is disposed adjacent the larger side surface of the first top part, the second top part has an increased surface area where the second top part is adjacent the first top part.

The second top part may include an upper surface having an elongated rectangular shape. First opposite side surfaces having smaller surface areas may be connected to shorter edges of the upper surface, and second opposite side surfaces having larger surface areas may be connected to longer edges of the upper surface. A lower surface may be connected to the first and second opposite side surfaces. Meanwhile, one of the second side surfaces of the second top part having the larger surface areas may be disposed to face one of the second side surfaces of the first top part having the larger surface areas. The leg of the second lead may extend from the lower surface of the second top part and the bonding wire may be bonded to the upper surface of the second top part. One of the legs extending from the first top part and the second top part may have a twisted portion. Accordingly, adjacent portion of the first and second top parts are increased in surface area, thereby promoting heat transfer from the first top part to the second top part. Alternatively, after forming the first and second top parts with a single lead frame, the first and second top parts may be disposed to have the larger side surfaces of the first and second top parts facing each other by twisting one of the legs extending from the first top part and the second top part such that the first part overlaps the second top part.

BRIEF DESCRIPTION OF THE DRAWINGS

The above and other features and advantages of the present invention will become apparent from the following description of exemplary embodiments given in conjunction with the accompanying drawings, in which:

FIGS. 1 (a) and (b) are a front view and a plan view of a conventional light emitting diode (LED) lamp, respectively;

FIGS. 4 (a) to (c) are plan views of conventional lead frames;

FIGS. 6 (a) and (b) are plan views of LED lamps according to other embodiments is of the present invention;

FIGS. 7 (a) to (c) are plan views of LED lamps according to other embodiments of the present invention;

DETAILED DESCRIPTION OF THE ILLUSTRATED EMBODIMENTS

Exemplary embodiments of the present invention are described in detail with reference to the accompanying drawings. It should be noted that the present invention is not limited to these embodiments and can be realized in various forms. The embodiments herein are given for the purpose of sufficient disclosure of the present invention and will help a person having ordinary knowledge in the art to gain a full understanding of the present invention. Like reference numerals denote like components throughout the drawings.

Figure 5:
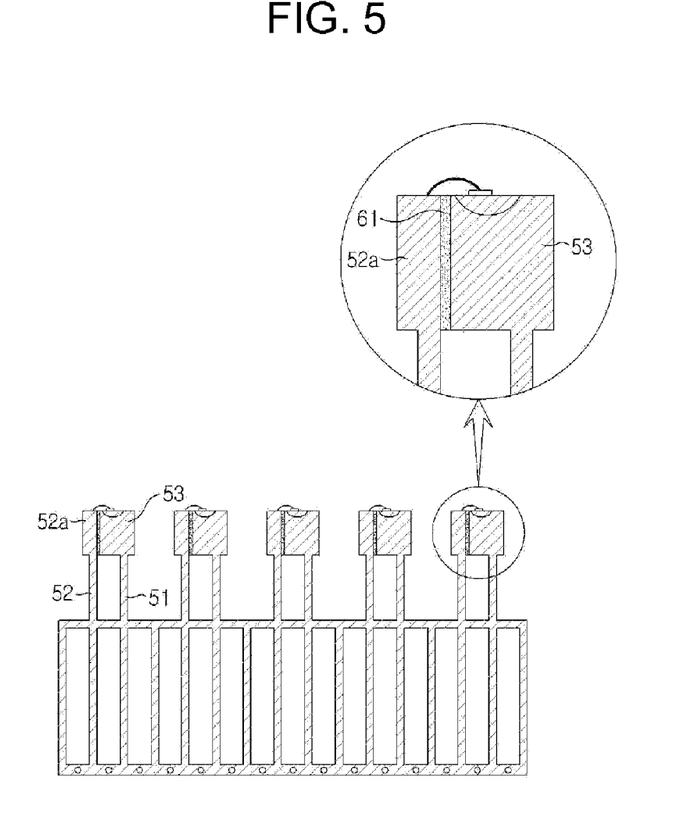
FIG. 5 is a view illustrating an LED lamp according to one embodiment of the present invention.
Figure 6:
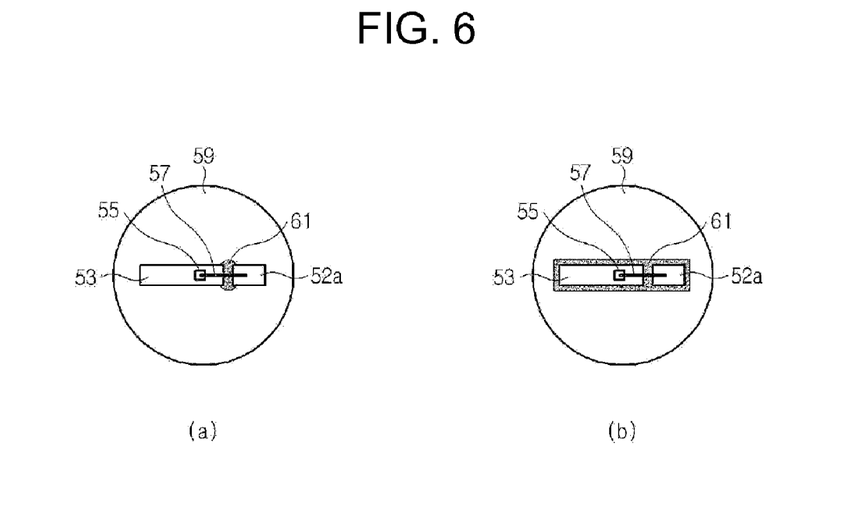

FIG. 5 is a view illustrating an LED lamp according to one embodiment of the present invention, and FIGS. 6 (a) and (b) are plan views of LED lamps according to other embodiments of the present invention.

Referring to FIGS. 5 and 6 (a), an alloy plate having a predetermined thickness is punched to form first leads 51 and second leads 52, as described with reference to FIG. 2. The first lead 51 has a first top part 53 and a leg extending from the first top part, and the second lead 52 has a second top part 52a and a leg extending from the second top part. The first and second is leads 51 and 52 are spaced apart from each other and supported by a support frame.

As shown in FIG. 6 (a) or (b), the first top part 53 may have an upper surface that has an elongated rectangular shape. In the first top part 53, first opposite side surfaces having smaller surface areas are connected to shorter edges of the upper surface, and second opposite side surfaces having larger surface areas are connected to longer edges of the upper surface, respectively. A lower surface is connected to the first and second opposite side surfaces. The second side surfaces may have a rectangular shape as shown in FIG. 5. However, the present invention is not limited thereto, and the second side surfaces may have different polygonal shapes. The second top part 52a is disposed adjacent one of the first side surfaces of the first top part 53 that have the smaller surface areas.

As described in FIG. 4 (b), the first and second top parts 53 and 52a may have ears and be formed in various shapes. The first and second top parts 53 and 52a can be easily formed by punching an alloy plate.

A heat coupling member 61 is formed between the first top part 53 and the second top part 52a to thermally couple them. The heat coupling member 61 is formed of an insulating material that has a higher thermal conductivity than epoxy or silicone which is used as a transparent encapsulating material in a conventional LED lamp. Since the heat coupling member 61 need not have transparency, it is not limited to particular materials and can be formed of various materials used for semiconductor packages. For example, the heat coupling member 61 can be formed of thermosetting resins such as epoxy, or formed of plastics including various kinds of thermoplastic resins. Here, since the heat coupling member 61 need not have transparency, it is possible to add various kinds of polymer binders, cross-linking agents, fillers, stabilizers, and the like. Accordingly, the heat coupling member 61 formed of such plastics has a is high glass transition temperature Tg along with a low thermal expansion coefficient and an improved thermal conductivity. Alternatively, the heat coupling member 61 can be formed of thermally stable ceramics.

A light emitting diode (LED) 55 is mounted on the upper surface of the first top part 53 and is connected to the second top part 52a via a bonding wire 57. The upper surface of the first top part 53 is formed with a cavity, in which the LED 55 is mounted. Then, an encapsulating material 59 is formed to surround the LED 55 and the first and second top parts 53 and 52a. Finally, the first and second top parts 53 and 52a are separated from the support frame, thereby completing an individual LED lamp.

Before forming the encapsulating material 59, a curable resin (not shown) containing a phosphor may be provided to cover the LED.

According to this embodiment, the heat coupling member 61 is disposed between the first top part 53 and the second top part 52*a*. The heat coupling member 61 lowers the thermal resistance of the LED lamp by promoting heat transfer from the first top part 53 to the second top part 52*a*. Simulation with a highly thermal conductivity material filled between the top parts under the same condition as in FIG. 4 (*b*) showed that the thermal resistance was lowered to 66° C./W.

The heat coupling member 61 may be formed to surround the side surfaces of the first and second top parts 53 and 52*a*, as shown in FIG. 6 (*b*). This configuration increases the number of heat transfer paths from the first top part 53 to the second top part 52*a*, thereby promoting heat transfer therebetween while further lowering the thermal resistance.

Figure 7:
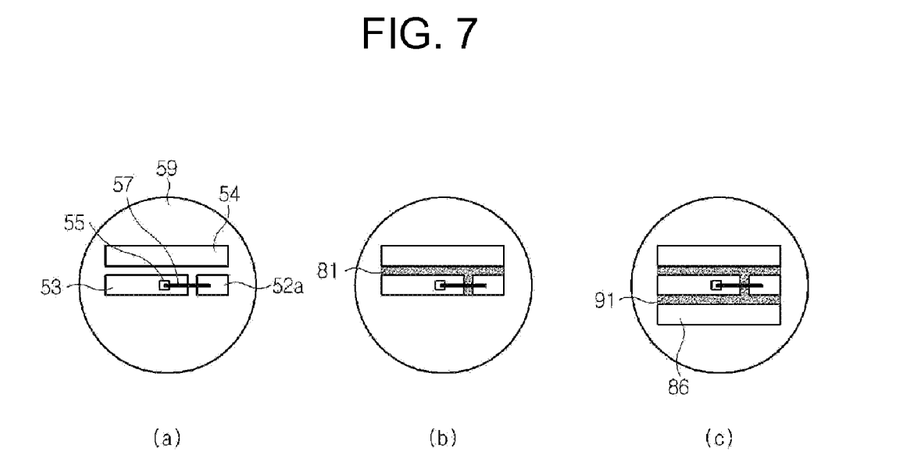
Figure 8:
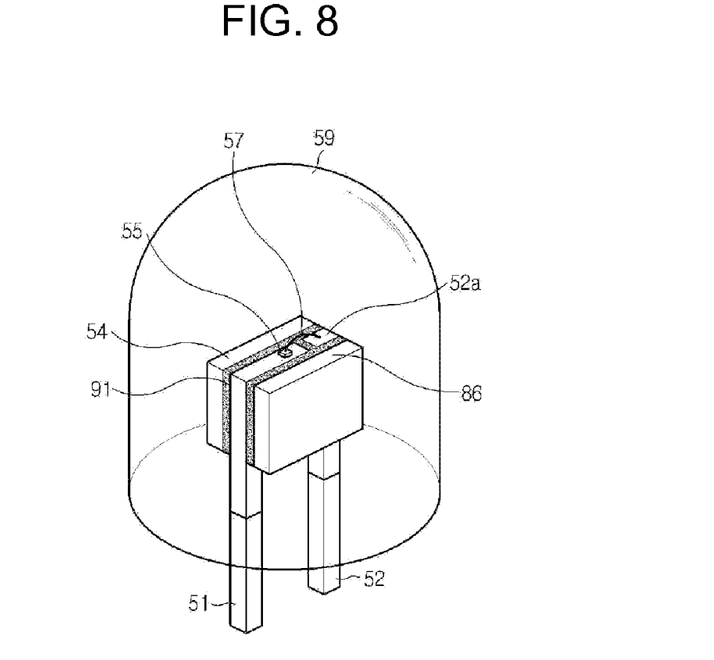
FIG. 8 is a perspective view of the LED lamp shown in FIG. 7 (c)

FIGS. 7 (*a*) to (*c*) are plan views of LED lamps according to other embodiments of the present invention, and FIG. 8 is a perspective view of the LED lamp shown in FIG. 7 (*c*).

Referring to FIG. 7 (*a*), a first top part 53 of a first lead is spaced apart from a second top part 52*a* of a second lead, as described with reference to FIG. 6. An LED 55 is mounted on the first top part 53 and is electrically connected to the second top part 52*a* via a bonding wire 57. Further, a third top part 54 is disposed adjacent the first top part 53 while being spaced apart from the first and second top parts 53 and 52*a*. The third top part 54 may be formed of the same material as that of the first top part 53. However, the present invention is not limited thereto, and thus the third top part 54 may be formed of a different material from that of the first top part 53.

A transparent encapsulating material 59 surrounds the LED 55, and the first to third top parts 53, 52*a* and 54.

According to this embodiment, since the third top part 54 is disposed adjacent the first top part 53, heat is transferred from the first top part 53 to the third top part 54, thereby lowering the thermal resistance of the LED lamp.

Meanwhile, although the third top part 54 is described as being spaced apart from the first and second top parts 53 and 52*a* in this embodiment, the third top part 54 may contact the first top part 53 or the second top part 52*a*. Here, if the third top part 54 is formed of a conductive material, the third top part 54 is electrically insulated from at least one of the first top part 53 and the second top part 52*a*.

Referring to FIG. 7 (*b*), an LED lamp includes a first top part 53, a second top part 52*a*, a third top part 54, and an LED 55 mounted on the first top part 53 and electrically connected to the second top part 52*a* via a bonding wire 57, as described with reference to FIG. 7 (*a*). Further, a transparent encapsulating material 59 surrounds the LED 55, and the first to third top parts 53, 52*a* and 54. Meanwhile, according to this embodiment, a heat coupling member 81 is provided to thermally couple the first to third top parts 53, 52*a* and 54. The heat coupling member 81 may be formed of the same material as that of the heat coupling member 61 described with reference to FIG. 6.

According to this embodiment, since the heat coupling member 81 thermally couples the first top part 53 to the second top part 52*a* while thermally coupling the first top part 53 to the third top part 54, heat can be transferred from the first top part 53 to the second and third top parts 52*a* and 54, thereby lowering the thermal resistance of the LED lamp.

Meanwhile, the heat coupling member 81 is described as thermally coupling all of the first to third top parts 53, 52*a* and 54 in this embodiment, but the present invention is not limited to this configuration. For example, the heat coupling member 81 may couple two of the first to third top parts 53, 52*a* and 54.

Referring to FIGS. 7 (*c*) and 8, an LED lamp includes a first top part 53, a second top part 52*a*, a third top part 54, and an LED 55 mounted on the first top part 53 and electrically connected to the second top part 52*a* via a bonding wire 57, as described with reference to FIG. 7 (*a*). Further, a fourth top part 86 is disposed adjacent the first top part 53 while being spaced from the first and second top parts 53 and 52*a*. A transparent encapsulating material 59 surrounds the LED 55, and the first to fourth top parts 53, 52*a*, 54 and 86. Meanwhile, according to this embodiment, legs extend from the first and second top parts 53 and 52*a* below the encapsulating material 59. That is, the first top part 53 and the leg extending therefrom constitute a first lead 51, and the second top part 52*a* and the leg extending therefrom constitute a second lead 52.

As shown in the figures, the first and second top parts 53 and 52*a* may be disposed between the third top part 54 and the fourth top part 86. As a result, heat can be is transferred from the first top part 53 to the third and fourth top parts 54 and 86 to lower the thermal resistance of the LED lamp. Here, since heat is transferred from second opposite side surfaces having large surface areas of the first top part 53 to the third and fourth top parts 54 and 86, the thermal resistance can be further reduced.

Additionally, a heat coupling member 91 is provided to thermally couple the first to fourth top parts 53, 52*a*, 54 and 86, thereby further lowering the thermal resistance of the LED lamp.

According to this embodiment, the heat coupling member 91 is described as thermally coupling all of the first to fourth top parts 53, 52*a*, 54 and 86, but the heat coupling member 91 may thermally couple only some of the first to fourth top parts 53, 52*a*, 54 and 86. Further, although the fourth top part 86 is described as being spaced apart from the first top part 53 and the second top part 52*a*, the fourth top part 86 may be configured to contact one of the first and second top parts 53 and 52*a* as described with reference to FIG. 7 (*a*).

Figure 9:
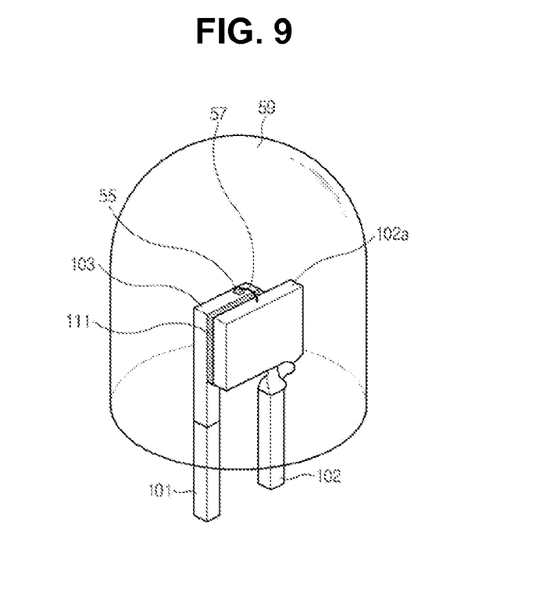
FIG. 9 is a perspective view of an LED lamp according to yet another embodiment of the present invention.

FIG. 9 is a perspective view of an LED lamp according to yet another embodiment of the present invention.

Referring to FIG. 9, a first lead 101 is spaced apart from a second lead 102. The first lead 101 has a first top part 103 and a leg extending therefrom. Further, the second lead 102 has a second top part 102*a* and a leg extending therefrom.

The first top part 103 includes an upper surface that has an elongated rectangular shape. In the first top part 103, first opposite side surfaces having smaller surface areas are connected to shorter edges of the upper surface, and second opposite side surfaces having larger surface areas are connected to longer edges of the upper surface, respectively. A lower surface is connected to the first and second opposite side surfaces.

The second top part 102*a* is disposed adjacent one of the second opposite side surfaces having the larger surface areas of the first top part 103. The second top part 102*a* may include an upper surface, a lower surface, and side surfaces having the same shapes as those of the first top part 103. The side surfaces of the second top part 102*a* that have the larger surface areas may be disposed to face one of the second side surfaces of the first top part 103.

An LED 55 is mounted on the upper surface of the first top part 103 and is electrically connected to the upper surface of the second top part 102*a* via a bonding wire 57. Here, the upper surface of the first top part 103 is formed with a cavity, in which the LED 55 is mounted. Further, a transparent encapsulating material 59 is provided to surround the LED 55, and the first and second top parts 103 and 102*a*.

Additionally, a heat coupling member 111 is interposed between the first top part 103 and the second top part 102*a* to thermally couple the first and second top parts 103 and 102*a*. The heat coupling member 111 may be formed of plastics or ceramics as described with reference to FIGS. 5 and 6.

According to this embodiment, the top part 102a of the second lead 102 is disposed adjacent the side surface of the first top part 103 that has the larger surface area. Accordingly, heat is transferred from the side surface of the first top part 103 having the larger surface area to the second top part 102a, thereby lowering the thermal resistance of the LED lamp. In addition, the second top part 102a is formed to have larger side surfaces and is disposed to face the first top part 103, thereby further lowering the thermal resistance of the LED lamp. Further, the first top part 103 is thermally coupled to the second top part 102a by means of the heat coupling member 111, thereby further lowering the thermal resistance of the LED lamp.

Figure 10:
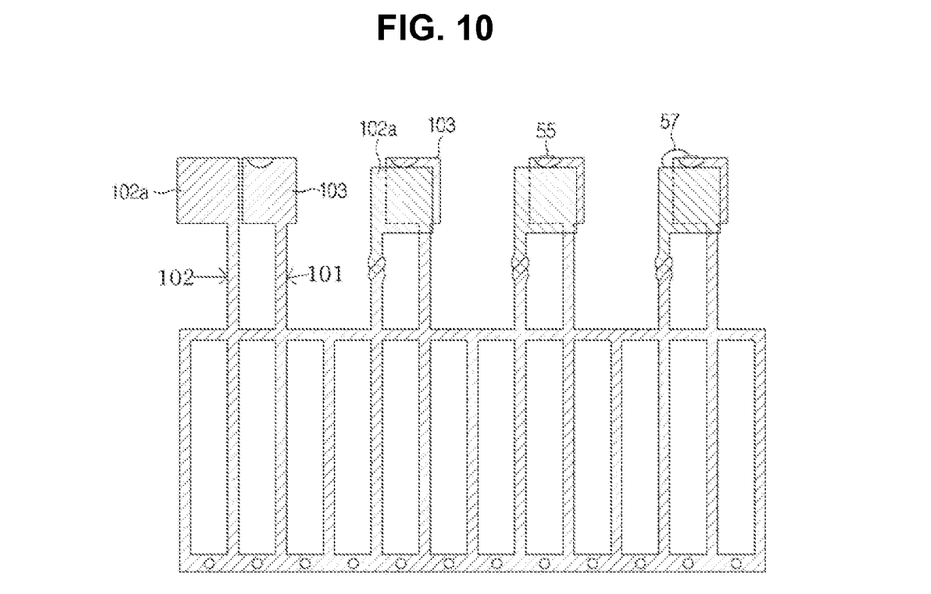
FIG. 10 is a view illustrating a method of manufacturing a lead frame used for the LED lamp shown in FIG. 9.

FIG. 10 is a view illustrating a method of manufacturing the LED lamp shown in is FIG. 9, in which processes are sequentially carried out with an identical lead frame.

Referring to FIG. 10, first, an alloy plate is punched to form a first lead 101 having a first top part 103 and a leg extending from the first top part 103, and a second lead 102 having a second top part 102a and a leg extending from the second top part 102a. The first and second leads 101 and 102 are supported by a support frame.

Here, the first top part 103 includes an upper surface having an elongated rectangular shape, first opposite side surfaces connected to shorter edges of the upper surface and having smaller surface areas, second opposite side surfaces connected to longer edges of the upper surface and having larger surface areas, and a lower surface connected to the first and second opposite side surfaces, as described with reference to FIG. 9.

Like the first top part 103, the second top part 102a includes larger side surfaces and smaller side surfaces. Further, the second top part 102a may have a lower surface connected to these side surfaces, and an upper surface which has an elongated rectangular shape similar to that of the first top part 103. The second top part 102a is formed along with the first top part 103 by punching the alloy plate, and is thus formed coplanar with the first top part 103.

Then, the leg extending from the second top part 102a is twisted such that the larger side surface of the second top part 102a is disposed adjacent one of the second side surfaces of the first top part 103. In other words, the first top part 103 overlaps the second top part 102a. Accordingly, the leg extending from the second top part 102a is formed with a twisted portion.

In this embodiment, the leg of the second top part 102a is twisted such that the first top part 103 overlaps the second top part 102a. Instead, the leg of the first top part 103 may be twisted such that the first top part 103 overlaps the second top part 102a.

Then, an LED 55 is mounted on the upper surface of the first top part 103 and is electrically connected to the second top part 102a via a bonding wire 57. Then, a transparent encapsulating material 59 (see FIG. 9) is provided to surround the LED 55, and the first and second top parts 103 and 102a, and the first and second leads 101 and 102 are separated from the support frame, thereby completing an individual LED lamp.

Additionally, a heat coupling member 111 (see FIG. 9) may be formed between the first top part 103 and the second top part 102a. The heat coupling member 111 may be formed of epoxy or other plastic materials having a higher thermal conductivity than the transparent encapsulating material 59. Alternatively, the heat coupling member 111 may be formed by disposing and coupling a ceramic material having a higher thermal conductivity between the top parts 103 and 102a.

According to this method, a single alloy plate may be used such that the larger side surfaces of the first and second top parts 103 and 102a are disposed to face each other. Hence, it is possible to manufacture an LED lamp with reduced thermal resistance without additionally incorporating the third or fourth top part 54 or 86 (see FIG. 7).

As apparent from the above description, in the LED lamp according to the embodiments of the present invention, a top part having a light emitting diode chip mounted thereon is thermally coupled to another top part disposed adjacent the top part by means of a heat coupling means, or one or more additional top parts are provided together with two top parts to the LED lamp, so that heat transfer from the top part having the LED chip to other parts can be promoted, thereby lowering thermal resistance of the LED lamp. Simulation results showed that, when an LED lamp includes a heat coupling member, the thermal resistance of the LED lamp is 20% or more lowered than an LED lamp having the same configuration except for the heat is coupling member. As such, heat is dissipated from the top part having the LED chip to the other parts, so that a boding temperature of the LED chip can be lowered, thereby improving optical efficiency and reliability of the LED lamp while increasing service life thereof.

Although various embodiments have been described with reference to the accompanying drawings, the present invention is not limited to the embodiments and the drawings. It should be understood that various modifications and changes can be made by those skilled in the art without departing from the spirit and scope of the present invention as defined by the accompanying claims.

What is claimed is:

1. A light emitting diode lamp, comprising:
    a first lead having a first top part and a leg extending from the first top part;
    a second lead spaced apart from the first lead, and having a second top part adjacent to the top part of the first lead and a leg extending from the second top part;
    a light emitting diode mounted on the first top part;
    a bonding wire connecting the light emitting diode to the second top part;
    an encapsulating material surrounding the light emitting diode and the first and second top parts;
    a heat coupling member thermally coupling the first top part to the second top part, the heat coupling member being formed of an insulating material having a higher thermal conductivity than the encapsulating material; and
    a third top part disposed adjacent to the first top part, the third top part being spaced apart from at least one of the first and second top parts within the encapsulating material, wherein the third top part is electrically insulated from all leads in the light emitting diode lamp, and wherein the entire surface of the third top part is within the encapsulating material.

2. The light emitting diode lamp according to claim 1, wherein the heat coupling member is disposed between the first and second top parts.

3. The light emitting diode lamp according to claim 1, wherein the heat coupling member surrounds side surfaces of the first and second top parts.

4. The light emitting diode lamp according to claim 1, wherein the first top part comprises:
    an upper surface having an elongated rectangular shape, the upper surface having the light emitting diode mounted thereon;
    first opposite side surfaces connected to shorter edges of the upper surface and having smaller surface areas;

second opposite side surfaces connected to longer edges of the upper surface and having larger surface areas; and a lower surface connected to the first and second opposite side surfaces.

5. The light emitting diode lamp according to claim 4, wherein the second top part is disposed adjacent to one of the first opposite side surfaces having the smaller surface areas.

6. The light emitting diode lamp according to claim 4, wherein the second top part is disposed adjacent one of the second opposite side surfaces having the larger surface areas.

7. The light emitting diode lamp according to claim 6, wherein the second top part includes side surfaces having smaller surface areas and side surfaces having larger surface areas, one of the larger side surfaces being disposed to face one of the second side surfaces of the first top part.

8. The light emitting diode lamp according to claim 7, wherein the heat coupling member is interposed between the side surfaces of the first and second top parts facing each other.

9. The light emitting diode lamp according to claim 7, wherein one of the legs extending from the first and second top parts has a twisted portion.

10. The light emitting diode lamp according to claim 1, wherein the heat coupling member thermally couples at least one of the first and second top parts to the third top part.

11. The light emitting diode lamp according to claim 1, further comprising:
    a fourth top part disposed adjacent to the first top part, the fourth top part being spaced apart from at least one of the first and second top parts within the encapsulating material.

12. The light emitting diode lamp according to claim 11, wherein the first and second top parts are disposed between the third and fourth top parts.

13. The light emitting diode lamp according to claim 12, wherein the heat coupling member thermally couples the first to fourth top parts.

14. A light emitting diode lamp, comprising:
    a first lead having a first top part and a leg extending from the first top part;
    a second lead spaced apart from the first lead, and having a second top part adjacent to the top part of the first lead and a leg extending from the second top part;
    a third top part disposed adjacent to the first top part while being spaced apart from at least one of the first and second top parts;
    a light emitting diode mounted on the first top part;
    a bonding wire connecting the light emitting diode to the second top part; and
    an encapsulating material entirely surrounding the light emitting diode and the first to third top parts,
    wherein the third top part is electrically insulated from all leads in the light emitting diode lamp.

15. The light emitting diode lamp according to claim 14, further comprising:
    a heat coupling member thermally coupling at least one of the first and second top parts to the third top part.

16. The light emitting diode lamp according to claim 14, further comprising:
    a fourth top part disposed adjacent to the first top part while being spaced apart from at least one of the first and second top parts, wherein the first and second top parts are disposed between the third and fourth top parts.

17. The light emitting diode lamp according to claim 16, further comprising:
    a heat coupling member thermally coupling at least one of the first and second top parts to the forth top part.

18. The light emitting diode lamp of claim 14, wherein the first top part comprises an upper surface having an elongated rectangular shape, the light emitting diode being mounted on the upper surface.

19. A light emitting diode lamp, comprising:
    a first lead having a first top part and a leg extending from the first top part, the first top part comprising an upper surface having an elongated rectangular shape, first opposite side surfaces connected to shorter edges of the upper surface, second opposite side surfaces connected to longer edges of the upper surface and having larger surface areas than the first opposite side surfaces, and a lower surface connected to the first opposite side surfaces and the second opposite side surfaces;
    a second lead spaced apart from the first lead, and having a second top part disposed adjacent to one of the second opposite side surfaces and a leg extending from the second top part;
    a light emitting diode mounted on the elongated rectangular shaped upper surface of the first top part;
    a bonding wire connecting the light emitting diode to the second top part; and
    an encapsulating material surrounding the light emitting diode, and the first and second top parts.

20. The light emitting diode lamp according to claim 19, wherein the second top part comprises an upper surface having an elongated rectangular shape, first opposite side surfaces connected to shorter edges of the upper surface and having smaller surface areas, second opposite side surfaces connected to longer edges of the upper surface and having larger surface areas, and a lower surface connected to the first and second opposite side surfaces; and
    wherein one of the second side surfaces of the second top part is disposed to face one of the second side surfaces of the first top part, the leg of the second lead extends from the lower surface of the second top part, the bonding wire is bonded to the upper surface of the second top part, and one of the legs extending from the first top part and the second top part has a twisted portion.

21. The light emitting diode lamp of claim 19, further comprising a heat coupling member connecting the first top part to the second top part, the heat coupling member comprising an insulating material having a higher thermal conductivity than the encapsulating material.

22. The light emitting diode lamp of claim 19, further comprising a third top part, wherein the entire surface of the third top part is within the encapsulating material.

* * * * *